(12) United States Patent
Inoue et al.

(10) Patent No.: US 12,444,586 B2
(45) Date of Patent: Oct. 14, 2025

(54) WAFER PLACEMENT TABLE

(71) Applicant: NGK Insulators, Ltd., Nagoya (JP)

(72) Inventors: Seiya Inoue, Handa (JP); Tatsuya Kuno, Nagoya (JP); Ikuhisa Morioka, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 149 days.

(21) Appl. No.: 18/166,585

(22) Filed: Feb. 9, 2023

(65) Prior Publication Data

US 2023/0317433 A1 Oct. 5, 2023

(30) Foreign Application Priority Data

Mar. 31, 2022 (JP) ................................. 2022-058340

(51) Int. Cl.
*H01J 37/32* (2006.01)
*H01L 21/683* (2006.01)

(52) U.S. Cl.
CPC .... *H01J 37/32724* (2013.01); *H01L 21/6833* (2013.01); *H01J 2237/002* (2013.01); *H01J 2237/2007* (2013.01)

(58) Field of Classification Search
CPC ........... H01J 37/32724; H01J 2237/002; H01J 2237/2007; H01L 21/6833;
(Continued)

(56) References Cited

U.S. PATENT DOCUMENTS 7,337,745 B1 * 3/2008 Komino .............. H01L 21/6831
118/724
2006/0193101 A1 * 8/2006 Sogabe ............... H01L 21/6831
361/234
(Continued)

FOREIGN PATENT DOCUMENTS

JP 2003-188247 A 7/2003
JP 2006-237348 A 9/2006
(Continued)

OTHER PUBLICATIONS

Taiwanese Office Action (Application No. 112105263) dated Feb. 20, 2024 (6 pages).
(Continued)

*Primary Examiner* — Sreeya Sreevatsa
(74) *Attorney, Agent, or Firm* — BURR PATENT LAW, PLLC (57) ABSTRACT

A wafer placement table includes: a ceramic plate having a wafer placement surface on its upper surface and incorporating an electrode; an electrically conductive plate provided on a lower surface side of the ceramic plate; an electrically conductive bonding layer that bonds the ceramic plate with the electrically conductive plate; a gas intermediate passage embedded in the electrically conductive bonding layer or provided at an interface between the electrically conductive bonding layer and the electrically conductive plate; a plurality of gas supply passages extending from the gas intermediate passage through the electrically conductive bonding layer and the ceramic plate to the wafer placement surface; and a gas introduction passage provided so as to extend through the electrically conductive plate and communicate with the gas intermediate passage, the number of the gas introduction passages being smaller than the number of the
(Continued)

gas supply passages communicating with the gas intermediate passage.

6 Claims, 8 Drawing Sheets

(58) Field of Classification Search
CPC ......... H01L 21/67109; H01L 21/68785; H01L 21/67103; H01L 21/68757
USPC ....................................................... 361/234
See application file for complete search history.

(56) References Cited

U.S. PATENT DOCUMENTS

| | | |
|---|---|---|
| 2011/0024049 A1 | 2/2011 | Stevenson et al. |
| 2017/0352568 A1 | 12/2017 | Cho et al. |
| 2019/0099977 A1 | 4/2019 | Parkhe et al. |
| 2020/0185204 A1 | 6/2020 | Ueda |
| 2020/0251371 A1 | 8/2020 | Kuno et al. |
| 2020/0294838 A1* | 9/2020 | Yoshikawa ........... C23C 16/466 |
| 2020/0312696 A1* | 10/2020 | Unno ................ C23C 16/45521 |
| 2021/0272834 A1* | 9/2021 | Takayama ............. C04B 37/005 |
| 2022/0148903 A1* | 5/2022 | Wang ................... C04B 41/009 |

FOREIGN PATENT DOCUMENTS

| | | | |
|---|---|---|---|
| JP | 2013-500605 A | 1/2013 | |
| JP | 2016-096336 A | 5/2016 | |
| JP | 2019-068044 A | 4/2019 | |
| JP | 2019-145598 A | 8/2019 | |
| JP | 2020-092196 A | 6/2020 | |
| JP | 2020-150071 A | 9/2020 | |
| JP | 2020-174180 A | 10/2020 | |
| JP | 2021141116 A * | 9/2021 | .............. B23Q 3/15 |
| TW | 201118979 A1 | 6/2011 | |
| TW | 201933530 A | 8/2019 | |
| WO | 2000/060658 A1 | 10/2000 | |
| WO | 2019/088204 A1 | 5/2019 | |

OTHER PUBLICATIONS

Japanese Notice of Third Party Submission of Publications (Application No. 2022-058340) dated Apr. 23, 2024.
Japanese Office Action (with English translation) dated Aug. 27, 2024 (Application No. 2022-058340).

* cited by examiner

WAFER PLACEMENT TABLE

BACKGROUND OF THE INVENTION

1. Field of the Invention

The present invention relates to a wafer placement table.

2. Description of the Related Art

Hitherto, there is known a wafer placement table that includes a ceramic plate having a wafer placement surface on its upper surface and incorporating an electrode, and a metal cooling plate bonded to the lower surface of the ceramic plate. In Patent Literature 1, in the thus configured wafer placement table, a plurality of gas supply passages that open at the wafer placement surface is provided so as to extend through the ceramic plate and the cooling plate in an up and down direction. Gas (for example, heat transfer gas, such as He gas) introduced from an outside into the gas supply passages is supplied to the lower surface of a wafer through the gas supply passages. In this case, the gas supply passages pass through the cooling plate in the up and down direction between parts of a refrigerant flow channel of the cooling plate. Therefore, hot spots tend to be formed around the openings of the gas supply passages on the wafer placement surface because of insufficient dissipation of heat, so the soaking performance of a wafer may be impaired. On the other hand, in Patent Literature 2, a gas intermediate passage is provided parallel to a wafer placement surface in a ceramic plate, the lower ends of a plurality of gas supply passages are communicated with the gas intermediate passage, and gas introduction passages smaller in number than the gas supply passages are provided so as to extend from the gas intermediate passage to the lower surface of a metal cooling plate. Thus, the number of the gas introduction passages that pass in the up and down direction between parts of a refrigerant flow channel is smaller than the number of the gas supply passages, so the soaking performance of a wafer is improved as compared to Patent Literature 1.

CITATION LIST

Patent Literature

PTL 1: Pamphlet of International Publication No. 2019/088204
PTL 2: Japanese Unexamined Patent Application Publication No. 2003-188247

SUMMARY OF THE INVENTION

However, in Patent Literature 2, when plasma is generated by applying a radio-frequency voltage between the cooling plate and a plasma generating electrode disposed over a wafer, electrical discharge may occur in the gas intermediate passage as a result of a potential gradient generated between the upper and lower sides of the gas intermediate passage. If electrical discharge occurs in the gas intermediate passage, the lower surface of the wafer may be charred or particles may be generated in the gas intermediate passage, so it is undesirable.

The present invention is made to solve such a problem, and it is a main object to prevent electrical discharge in a gas intermediate passage while improving the soaking performance of a wafer.

[1] A wafer placement table of the present invention includes: a ceramic plate having a wafer placement surface on its upper surface and incorporating an electrode; an electrically conductive plate provided on a lower surface side of the ceramic plate; an electrically conductive bonding layer that bonds the ceramic plate with the electrically conductive plate; a gas intermediate passage embedded in the electrically conductive bonding layer or provided at an interface between the electrically conductive bonding layer and the electrically conductive plate; a plurality of gas supply passages extending from the gas intermediate passage through the electrically conductive bonding layer and the ceramic plate to the wafer placement surface; and a gas introduction passage provided so as to extend through the electrically conductive plate in an up and down direction and communicate with the gas intermediate passage, the number of the gas introduction passages being smaller than the number of the gas supply passages communicating with the gas intermediate passage.

In the wafer placement table, when gas is introduced through the gas introduction passage that is open at the lower surface of the electrically conductive plate, the gas passes through the gas intermediate passage and is distributed to the plurality of gas supply passages, and the gas is supplied to the lower surface of a wafer. In the wafer placement table, the number of the gas introduction passages extending through the electrically conductive plate is smaller than the number of the gas supply passages. Therefore, in comparison with the case where the number of the gas introduction passages extending through the electrically conductive plate is equal to the number of the gas supply passages, the soaking performance of a wafer improves. The upper surface of the gas intermediate passage is the electrically conductive bonding layer, the lower surface of the gas intermediate passage is the electrically conductive plate, and the electrically conductive bonding layer and the electrically conductive plate are in contact with each other and have the same potential. Therefore, no potential gradient occurs between the upper and lower sides of the gas intermediate passage, so electrical discharge in the gas intermediate passage is prevented.

[2] In the above-described wafer placement table (the wafer placement table described in [1]), the gas intermediate passage may have at least one of a first recessed portion provided on an upper surface of the electrically conductive plate or a second recessed portion provided on a lower surface of the electrically conductive bonding layer. With this configuration, it is possible to relatively easily manufacture the wafer placement table according to the present invention.

[3] In the above-described wafer placement table (the wafer placement table described in [1] or [2]), the gas introduction passage may be provided one for each gas intermediate passage. With this configuration, the number of the gas introduction passages for each gas intermediate passage is minimum (one), so the soaking performance of a wafer further improves.

[4] In the above-described wafer placement table (the wafer placement table described in any one of [1] to [3]), the gas intermediate passage may have a depth of greater than or equal to 0.1 mm and less than or equal to 2 mm.

[5] In the above-described wafer placement table (the wafer placement table described in any one of [1] to [4]), the gas intermediate passage may be annular in plan view, and the gas supply passages and the gas intermediate passage may be connected by an auxiliary passage provided in the same plane as a plane in which the gas intermediate passage is provided.

[6] In the above-described wafer placement table (the wafer placement table described in any one of [1] to [5]), the gas supply passages each may have an electrically insulating porous plug. With this configuration, it is possible to reduce electrical discharge in the gas supply passages.

[7] In the above-described wafer placement table (the wafer placement table described in [6]), a lower end of the porous plug may be in contact with at least one of the electrically conductive bonding layer or the electrically conductive plate. With this configuration, the lower end of the porous plug has the same potential as the electrically conductive bonding layer and the electrically conductive plate. Therefore, no potential gradient occurs between the lower end of the porous plug and the electrically conductive bonding layer or between the lower end of the porous plug and the electrically conductive plate, so it is possible to reduce generation of electrical discharge around the lower end of the porous plug.

[8] In the above-described wafer placement table (the wafer placement table described in [7]), each of the gas supply passages may have a bonding layer penetrating part extending through the electrically conductive bonding layer and a ceramic plate penetrating part extending through the ceramic plate, a diameter of the bonding layer penetrating part may be less than a diameter of the ceramic plate penetrating part, and a lower end of the porous plug may be in contact with an area around the bonding layer penetrating part in the electrically conductive bonding layer. With this configuration, when the porous plug is inserted in each of the gas supply passages, it is possible to bring the lower end of the porous plug into contact with the bonding layer only by inserting the porous plug until the porous plug touches the bonding layer.

BRIEF DESCRIPTION OF DRAWINGS

FIG. 7 is a partially enlarged sectional view showing another example of a bonding layer penetrating part 52a.

FIG. 8 is a partially enlarged sectional view showing another example of the bonding layer penetrating part 52a.

DETAILED DESCRIPTION OF THE INVENTION

Next, an embodiment of the present invention will be described with reference to the accompanying drawings.

Figure 1:
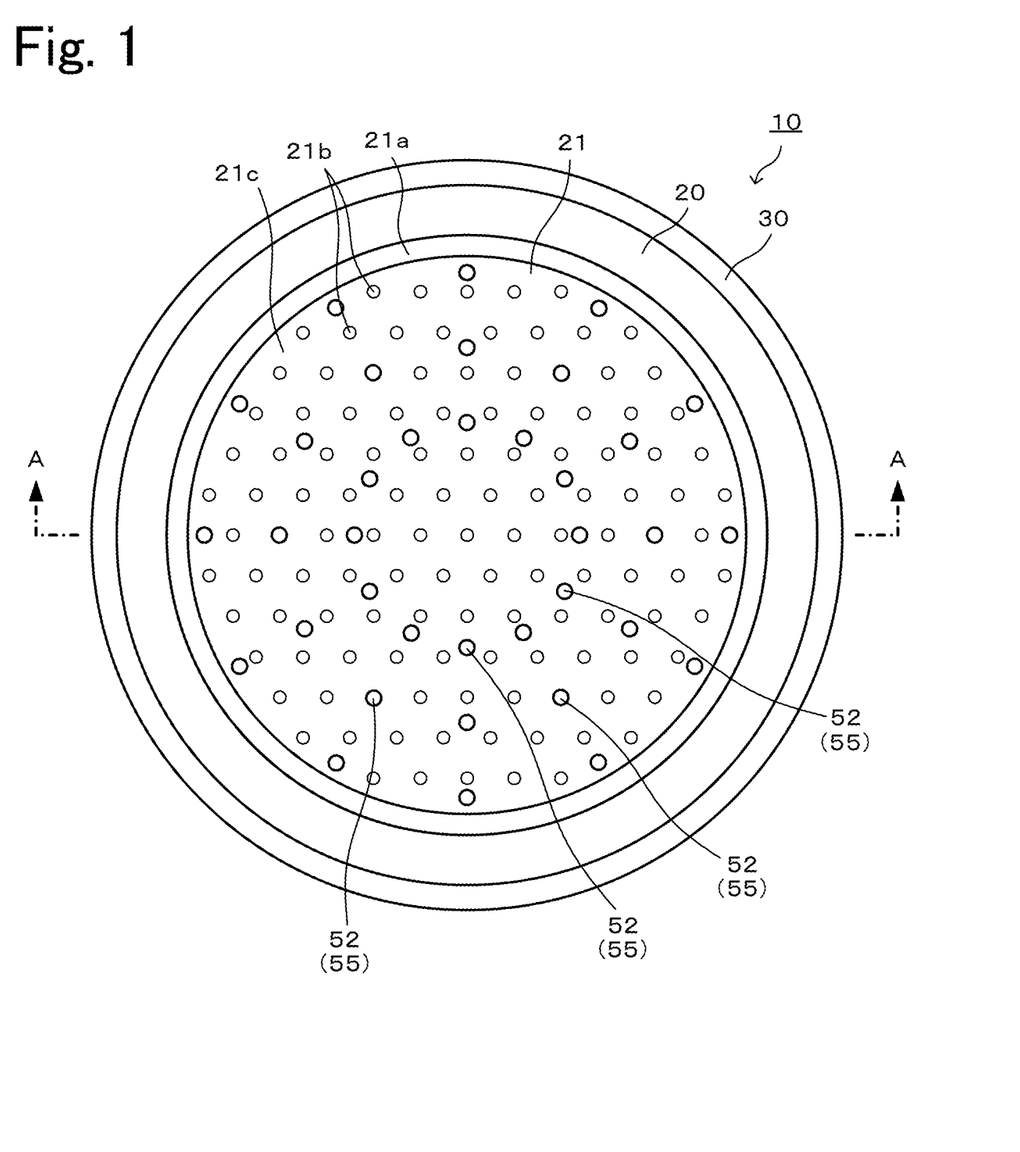
FIG. 1 is a plan view of a wafer placement table 10.
Figure 2:
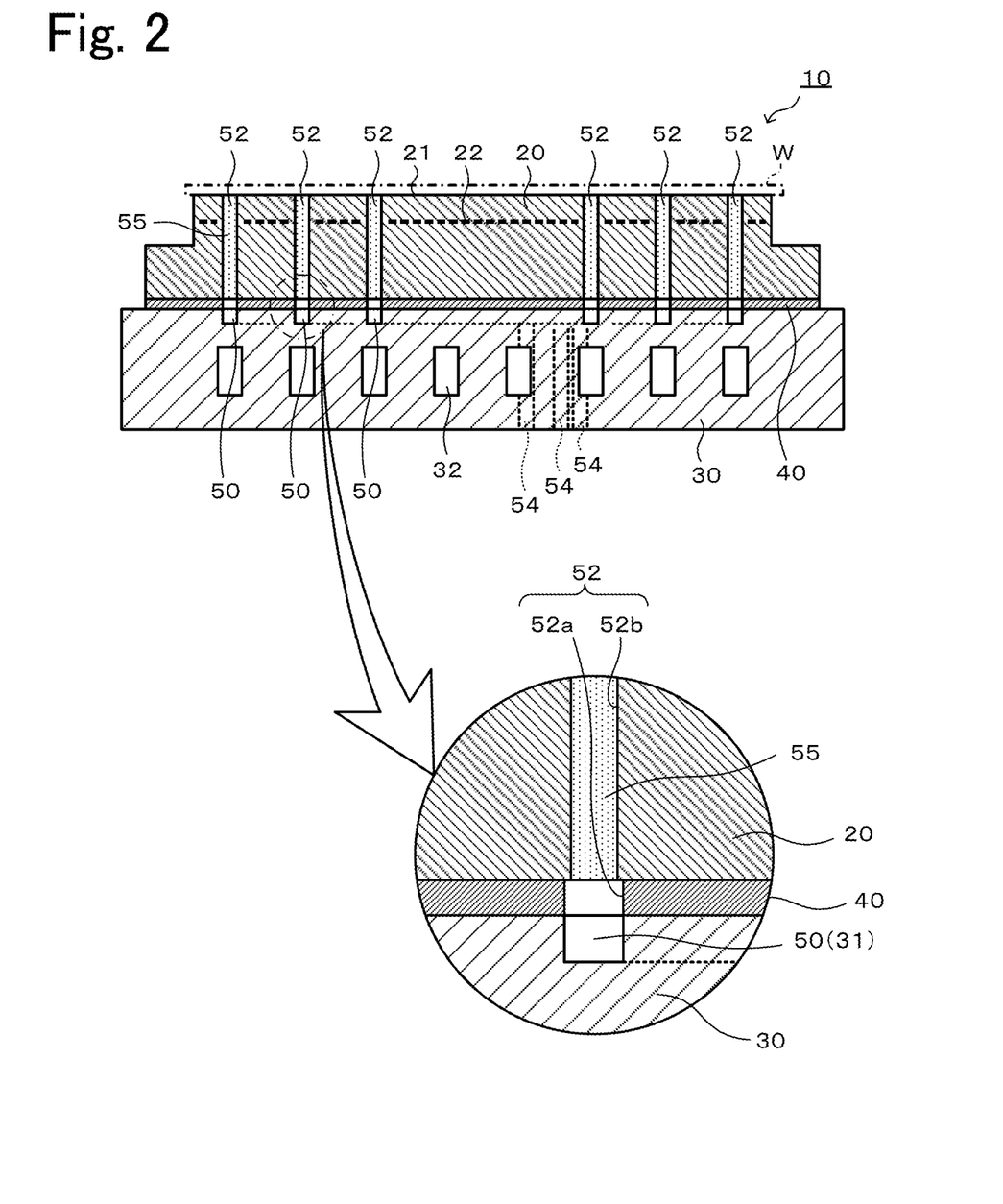
FIG. 2 is a sectional view taken along the line A-A in FIG. 1.
Figure 3:
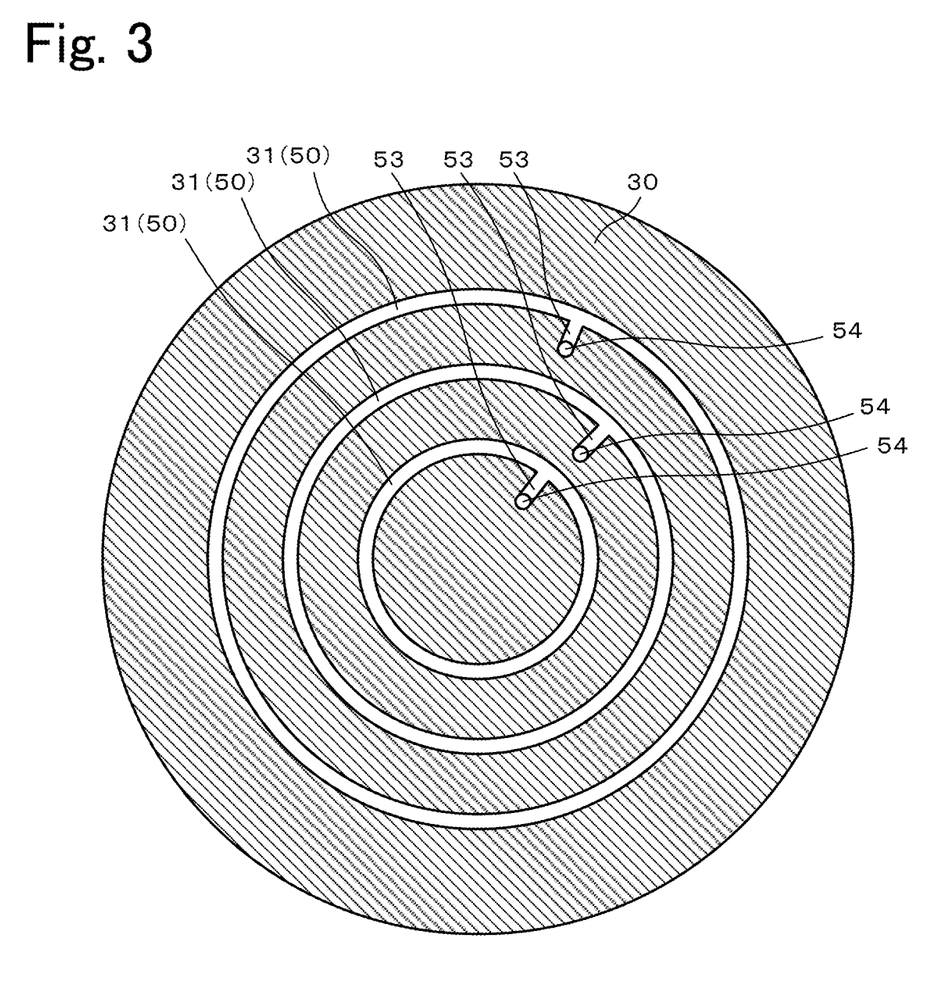
FIG. 3 is a sectional view of the wafer placement table 10, taken along a horizontal plane passing through gas intermediate passages 50 when viewed from above.
Figure 4:
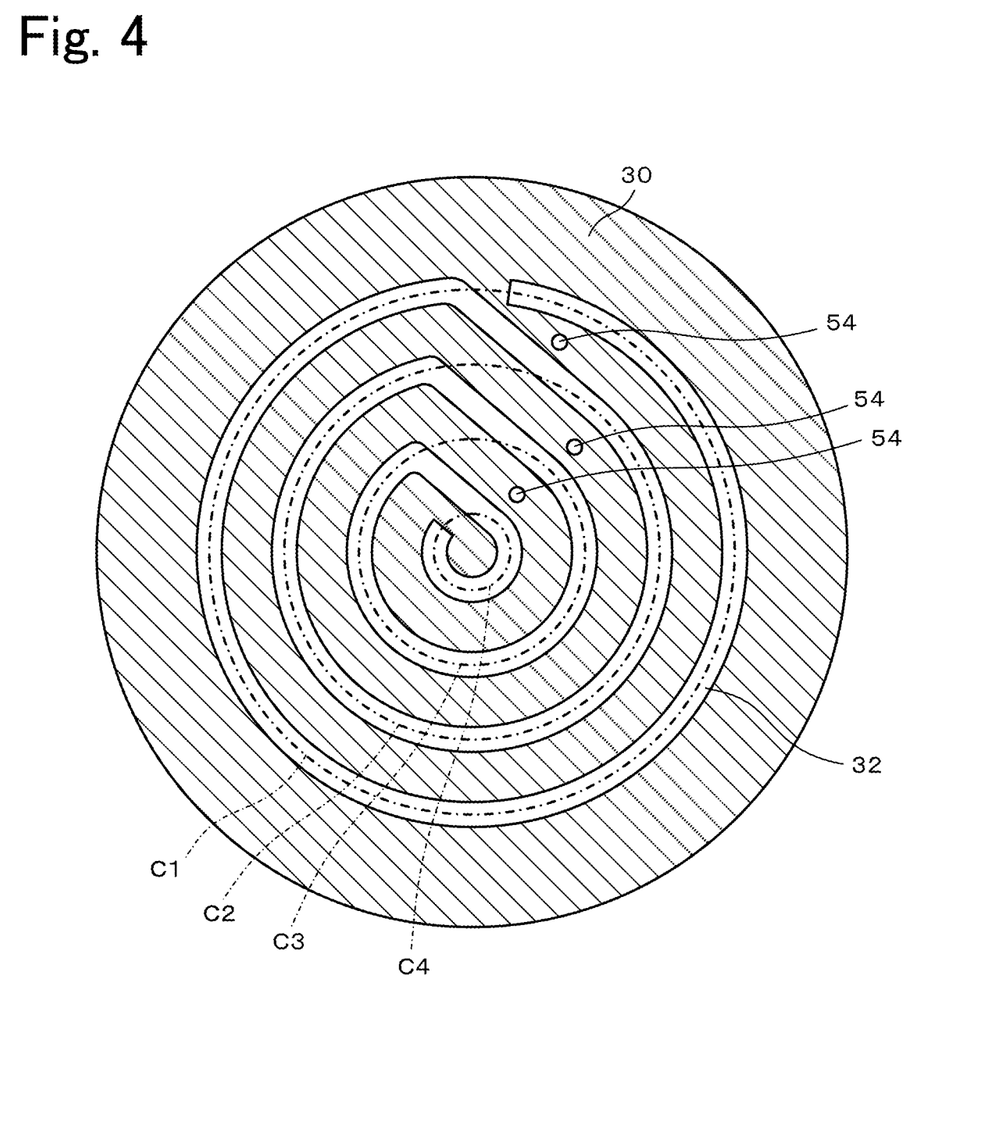
FIG. 4 is a sectional view of the wafer placement table 10, taken along a horizontal plane passing through a refrigerant flow channel 32 when viewed from above.
Figure 5:
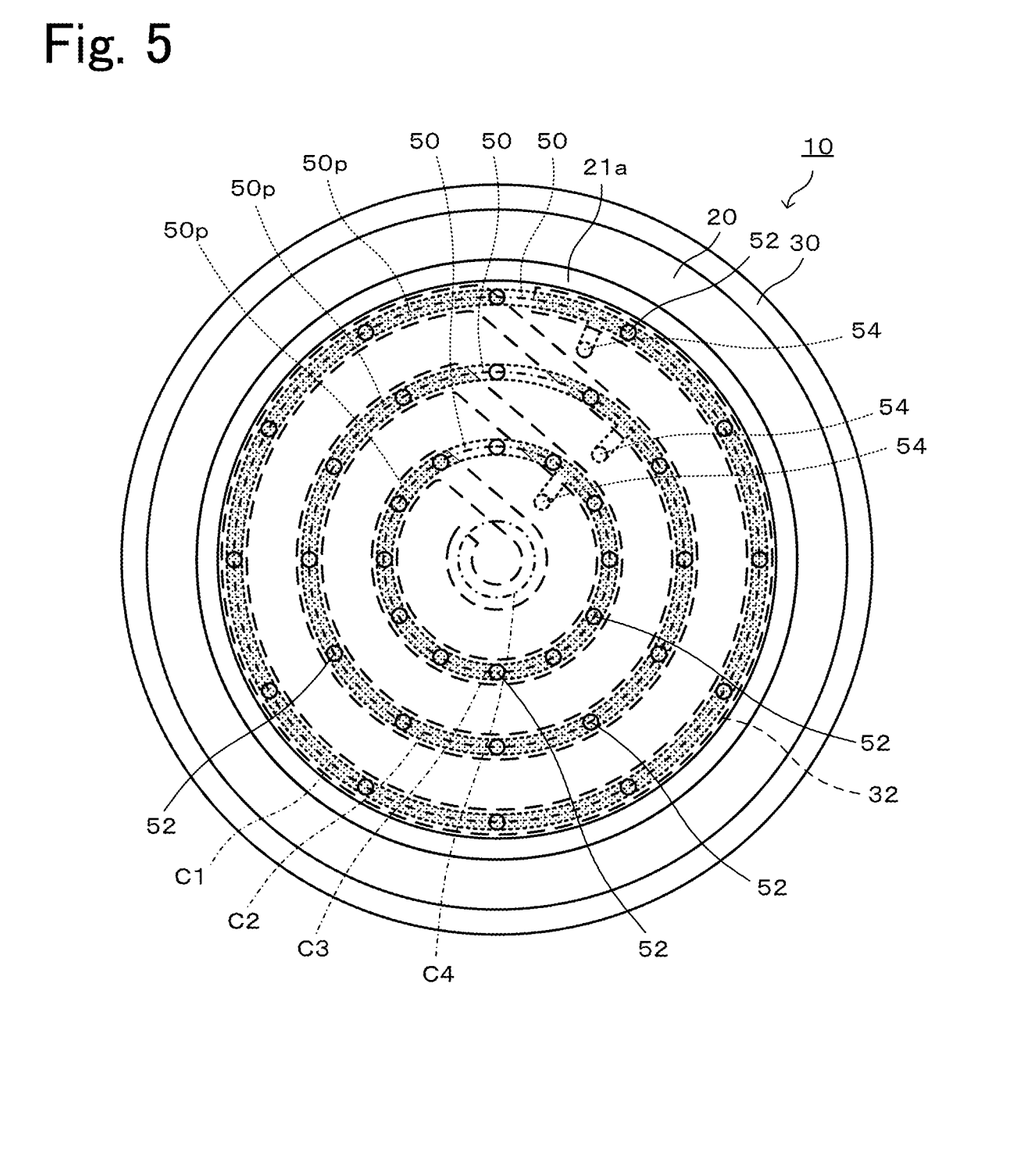
FIG. 5 is a view in which the refrigerant flow channel 32 and the like are drawn in the plan view of the wafer placement table 10.

FIG. 1 is a plan view of a wafer placement table 10. FIG. 2 is a sectional view taken along the line A-A in FIG. 1. FIG. 3 is a sectional view of the wafer placement table 10, taken along a horizontal plane passing through gas intermediate passages 50 when viewed from above. FIG. 4 is a sectional view of the wafer placement table 10, taken along a horizontal plane passing through a refrigerant flow channel 32 when viewed from above. FIG. 5 is a view in which the refrigerant flow channel 32 and the like are drawn in the plan view of the wafer placement table 10. In the specification, the words "up" and "down" do not indicate an absolute positional relationship. Therefore, depending on the orientation of the wafer placement table 10, "up" and "down" can be "down" and "up" or can be "left" and "right" or can be "front" and "rear".

As shown in FIG. 2, the wafer placement table 10 includes a ceramic plate 20, an electrically conductive plate 30, an electrically conductive bonding layer 40, gas intermediate passages 50, gas supply passages 52, and gas introduction passages 54.

The ceramic plate 20 is a ceramic disk (for example, a diameter of 300 mm and a thickness of 5 mm), such as alumina sintered body and aluminum nitride sintered body. The upper surface of the ceramic plate 20 is a wafer placement surface 21 on which a wafer W is placed. The ceramic plate 20 incorporates an electrode 22. As shown in FIG. 1, on the wafer placement surface 21 of the ceramic plate 20, an annular seal band 21a is formed along the outer edge, and a plurality of circular small projections 21b is formed all over the surface on the inner side of the seal band 21a. The seal band 21a and the circular small projections 21b have the same height and have a height of, for example, several micrometers to several tens of micrometers. The electrode 22 is a planar mesh electrode used as an electrostatic electrode and is connected to an external direct-current power supply via a power supply member (not shown). A low pass filter is disposed in the middle of the power supply member. The power supply member is electrically insulated from the electrically conductive bonding layer 40 and the electrically conductive plate 30. When a direct-current voltage is applied to the electrode 22, a wafer W is attracted and fixed to the wafer placement surface 21 (specifically, the upper surface of the seal band and the upper surfaces of the circular small projections) by electrostatic attraction force. When application of direct-current voltage is stopped, attraction and fixation of the wafer W to the wafer placement surface 21 are released. Part of the wafer placement surface 21 where the seal band 21a or the circular small projections 21b are not provided is referred to as a reference surface 21c.

The electrically conductive plate 30 is a disk having good thermal conductivity (a disk having a diameter equal to or greater than the diameter of the ceramic plate 20). The refrigerant flow channel 32 in which refrigerant circulates is formed in the electrically conductive plate 30. Refrigerant flowing through the refrigerant flow channel 32 is preferably liquid and preferably has electrically insulating properties. Examples of the liquid having electrically insulating properties include fluoroinert fluid. The refrigerant flow channel 32 is formed in a one-stroke pattern from one end (inlet) to the other end (outlet) over the entire area of the electrically conductive plate 30 in plan view. As shown in FIG. 4, the refrigerant flow channel 32 is provided so as to be routed in a one-stroke pattern from one end to the other end in accordance with multiple circles disposed such that a plurality of imaginary circles (alternate long and short-dashed line circles C1 to C4; here, the circles C1 to C4 are concentric circles) having different diameters in plan view.

Specifically, to route the refrigerant flow channel 32 in a one-stroke pattern from one end to the other end, the refrigerant flow channel 32 is routed so as to trace the imaginary circles while connecting two inner and outer imaginary circles of the multiple circles. A supply port and collection port of an external refrigerant apparatus (not shown) are respectively connected to one end and the other end of the refrigerant flow channel 32. Refrigerant supplied from the supply port of the external refrigerant apparatus to one end of the refrigerant flow channel 32 passes through the refrigerant flow channel 32 and then returns to the collection port of the external refrigerant apparatus from the other end of the refrigerant flow channel 32, the refrigerant is adjusted in temperature, and then the refrigerant is supplied to one end of the refrigerant flow channel 32 through the supply port again. The electrically conductive plate 30 is connected to a radio-frequency (RF) power supply and is also used as an RF electrode.

Examples of the material of the electrically conductive plate 30 include a metal material and a composite material of metal and ceramics. Examples of the metal material include Al, Ti, Mo, and alloys of them. Examples of the composite material of metal and ceramics include a metal matrix composite material (MMC) and a ceramic matrix composite material (CMC). Specific examples of such composite materials include a material including Si, SiC, and Ti (also referred to as SiSiCTi), a material obtained by impregnating an SiC porous body with Al and/or Si, and a composite material of $Al_2O_3$ and TiC. A material having a coefficient of thermal expansion close to that of the material of the ceramic plate 20 is preferably selected as the material of the electrically conductive plate 30.

The electrically conductive bonding layer 40 is, for example, a metal bonding layer and bonds the lower surface of the ceramic plate 20 with the upper surface of the electrically conductive plate 30. The electrically conductive bonding layer 40 is formed by, for example, TCB (thermal compression bonding). TCB is a known method of sandwiching a metal bonding material between two members to be bonded and bonding the two members in a state of being heated to a temperature lower than or equal to a solidus temperature of the metal bonding material while applying pressure.

The gas intermediate passages 50 are provided parallel to the wafer placement surface 21 at the interface between the electrically conductive bonding layer 40 and the electrically conductive plate 30. The state "parallel" includes not only a completely parallel state but also a state that falls within the range of an allowable error (for example, tolerance) even when the state is not completely parallel. The gas intermediate passages 50 each have a recessed groove 31 (first recessed portion) provided on the upper surface of the electrically conductive plate 30 and are formed when the upper surfaces of the recessed grooves 31 are covered with the electrically conductive bonding layer 40. As shown in FIG. 5, each of the gas intermediate passages 50 is provided in an annular shape so as to overlap any one of the plurality of imaginary circles C1 to C4 in plan view. Specifically, of the three gas intermediate passages 50, the first gas intermediate passage 50 from the outer periphery of the wafer placement table 10 overlaps the imaginary circle C1 with the greatest diameter, the second gas intermediate passage 50 overlaps the imaginary circle C2 with the second greatest diameter, and the third gas intermediate passage 50 overlaps the imaginary circle C3 with the third greatest diameter. Each of the gas intermediate passages 50 has an overlapping part 50p (the shaded parts in FIG. 5) that overlaps the refrigerant flow channel 32 along the refrigerant flow channel 32 in plan view.

As shown in FIG. 2, the gas supply passages 52 are passages that extend from the gas intermediate passages 50 through the electrically conductive bonding layer 40 and the ceramic plate 20 in the up and down direction to the reference surface 21c (FIG. 1) of the wafer placement surface 21. Each of the gas supply passages 52 has a bonding layer penetrating part 52a extending through the electrically conductive bonding layer 40 and a ceramic plate penetrating part 52b extending through the ceramic plate 20. In the present embodiment, the diameter of the bonding layer penetrating part 52a is equal to or greater than the diameter of the ceramic plate penetrating part 52b. A plurality of (here, 12) the gas supply passages 52 is provided for each gas intermediate passage 50. Each of the gas supply passages 52 has an electrically insulating porous plug 55 that allows flow of gas. Here, the porous plug 55 is fixed in a state of being filled in the ceramic plate penetrating part 52b of the gas supply passage 52. Specifically, the outer peripheral surface of the porous plug 55 and the inner peripheral surface of the ceramic plate penetrating part 52b may be bonded to each other, or an external thread portion provided on the outer peripheral surface of the porous plug 55 may be screwed to an internal thread portion provided on the inner peripheral surface of the ceramic plate penetrating part 52b. The upper surface of the porous plug 55 is located at the same level with the reference surface 21c of the wafer placement surface 21. The lower surface of the porous plug 55 is located at the same level with the lower surface of the ceramic plate 20. A porous bulk body obtained by sintering using ceramic powder may be used as the porous plug 55. For example, alumina, aluminum nitride, or the like may be used as ceramics. The porous plug 55 preferably has a porosity of higher than or equal to 30% and preferably has a mean pore size of greater than or equal to 20 μm.

Each of the gas introduction passages 54 is provided so as to extend through the electrically conductive plate 30 in the up and down direction and communicate with the gas intermediate passage 50 via a gas auxiliary passage 53 (FIG. 3). The gas auxiliary passage 53 is a passage that connects the gas introduction passage 54 with the gas intermediate passage 50 and is provided parallel to the wafer placement surface 21 at the interface between the electrically conductive bonding layer 40 and the electrically conductive plate 30. The plurality of gas supply passages 52 is provided for each gas intermediate passage 50. The number of the gas introduction passages 54 (here, one) is less than the number of the gas supply passages 52. The gas introduction passages 54 extend through the electrically conductive plate 30 in the up and down direction between parts of the refrigerant flow channel 32.

Next, an example of use of the thus configured wafer placement table 10 will be described. Initially, in a state where the wafer placement table 10 is placed in a chamber (not shown), a wafer W is mounted on the wafer placement surface 21. Then, the inside of the chamber is decompressed by a vacuum pump and adjusted into a predetermined degree of vacuum, electrostatic attraction force is generated by applying a direct-current voltage to the electrode 22 of the ceramic plate 20, and the wafer W is attracted and fixed to the wafer placement surface 21 (specifically, the upper surface of the seal band 21a or the upper surfaces of the circular small projections 21b). Subsequently, the inside of the chamber is set to a reaction gas atmosphere with a predetermined pressure (for example, several tens to several hundreds of pascals). In this state, plasma is generated by applying an RF voltage between an upper electrode (not shown) provided at a ceiling part in the chamber and the electrically conductive plate 30 of the wafer placement table 10. The surface of the wafer W is processed by the generated plasma. Refrigerant circulates through the refrigerant flow channel 32 of the electrically conductive plate 30. Back-side gas is introduced from a gas cylinder (not shown) to the gas introduction passages 54. Heat transfer gas (for example, He gas or the like) may be used as the back-side gas. The back-side gas introduced into the gas introduction passages 54 passes through the gas intermediate passages 50 and is distributed to the plurality of gas supply passages 52. The back-side gas is supplied and encapsulated in a space between the back surface of the wafer W and the reference surface 21c of the wafer placement surface 21. With the presence of the back-side gas, heat transfer between the wafer W and the ceramic plate 20 is efficiently performed.

Figure 6A:
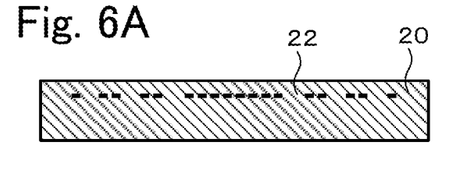
FIGS. 6A to 6F are manufacturing process charts of the wafer placement table 10.
Figure 6B:
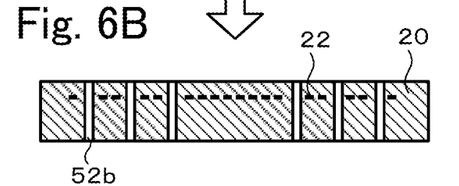

Next, an example of manufacture of the wafer placement table 10 will be described with reference to FIGS. 6A to 6F. FIGS. 6A to 6F are manufacturing process charts of the wafer placement table 10. Here, the case in which the electrically conductive plate 30 is made from an MMC will be illustrated. First, the ceramic plate 20 incorporating the electrode 22 is prepared (FIG. 6A). For example, a molded body of ceramic powder, incorporating the electrode 22, is made, and the ceramic plate 20 is obtained by firing the molded body by hot pressing. The ceramic plate penetrating parts 52b that will be finally parts of the gas supply passages 52 are formed in the ceramic plate 20 (FIG. 6B). The ceramic plate penetrating parts 52b are formed so as to extend through the ceramic plate 20 in the up and down direction of the electrode 22.

Figure 6C:
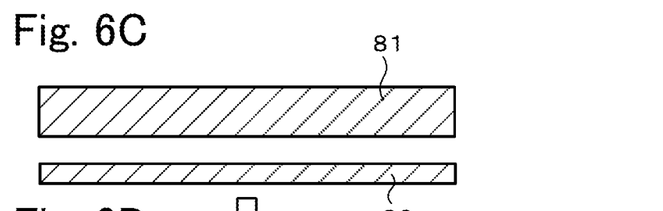
Figure 6D:
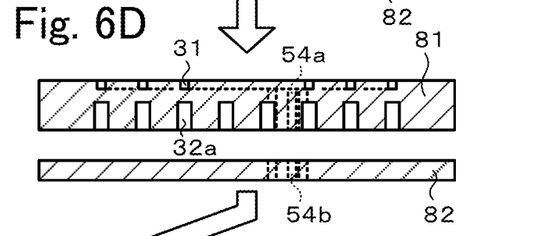

Concurrently, two MMC disk members 81, 82 are prepared (FIG. 6C). Grooves and holes are formed as needed in the MMC disk members 81, 82 by machining (FIG. 6D). Specifically, a recessed groove 32a that will be finally the refrigerant flow channel 32 is formed on the lower surface of the upper-side MMC disk member 81, and recessed grooves 31 that will be finally the gas intermediate passages 50 are formed on the upper surface of the MMC disk member 81. Through-holes 54a that will be finally parts of the gas introduction passages 54 are formed so as to extend from the recessed grooves 31 to the lower surface of the MMC disk member 81. In addition, through-holes 54b that will be finally parts of the gas introduction passages 54 are formed in the lower-side MMC disk member 82. When the ceramic plate 20 is made of alumina, the MMC disk members 81, 82 are preferably made of SiSiCTi or AlSiC. This is because the coefficient of thermal expansion of alumina and the coefficient of thermal expansion of SiSiCTi or AlSiC are almost the same.

The disk member made of SiSiCTi can be made by, for example, as follows. Initially, a powder mixture is made by mixing silicon carbide, metal Si and metal Ti. After that, a disk-shaped molded body is made by uniaxial pressing of the obtained powder mixture, and the molded body is sintered by hot pressing in an inert atmosphere, with the result that the disk member made of SiSiCTi is obtained.

Figure 6E:
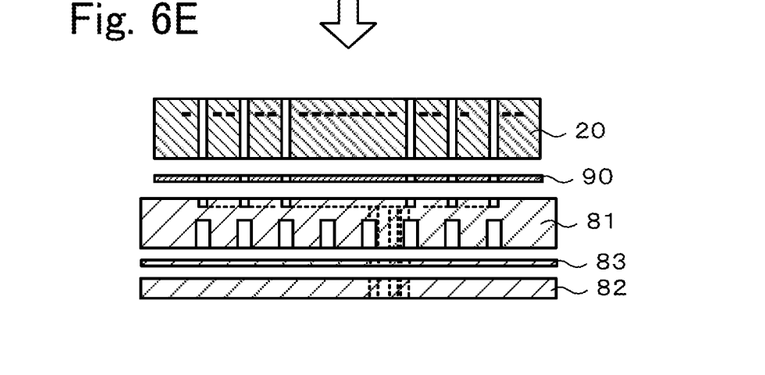
Figure 6F:
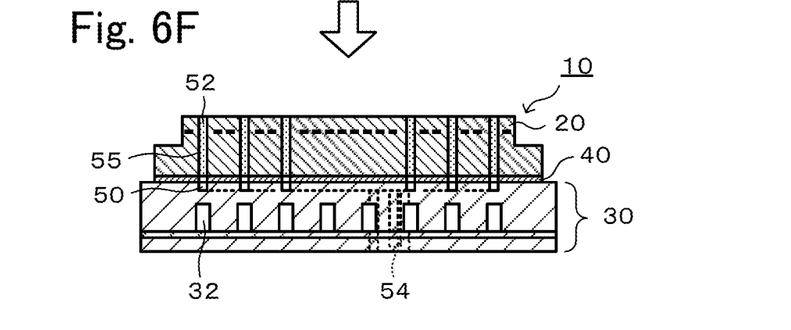

Subsequently, after the ceramic plate 20, the MMC disk member 81, and the MMC disk member 82 are bonded by TCB, the overall shape is adjusted, and the porous plugs 55 are attached, with the result that the wafer placement table 10 is obtained (FIGS. 6E and 6F). Specifically, a laminated body is obtained by sandwiching a metal bonding material 83 between the upper surface of the lower-side MMC disk member 82 and the lower surface of the upper-side MMC disk member 81, and sandwiching a metal bonding material 90 between the upper surface of the upper-side MMC disk member 81 and the lower surface of the ceramic plate 20. Through-holes that will be finally parts of the gas introduction passages 54 are formed in advance in the metal bonding material 83, and through-holes that will be finally parts (bonding layer penetrating parts 52a) of the gas supply passages 52 are formed in advance in the metal bonding material 90. Subsequently, the laminated body is pressurized at a temperature lower than or equal to a solidus temperature of the metal bonding materials 83, 90 (for example, higher than or equal to a temperature obtained by subtracting 20° C. from the solidus temperature and lower than or equal to the solidus temperature) to perform bonding, after that the temperature is returned to a room temperature. Thus, the two MMC disk members 81, 82 are bonded by the metal bonding material 83 into the electrically conductive plate 30. The ceramic plate 20 and the electrically conductive plate 30 are bonded by the metal bonding material 90. The metal bonding material 90 becomes the electrically conductive bonding layer 40. An Al—Mg bonding material or an Al—Si—Mg bonding material may be used as the metal bonding materials 83, 90 at this time. When, for example, TCB is performed by using an Al—Si—Mg bonding material, the laminated body is pressurized in a state of being heated in a vacuum atmosphere. The metal bonding materials 83, 90 with a thickness of about 100 μm are preferable.

In the wafer placement table 10 described in detail above, when back-side gas is introduced through the gas introduction passages 54 that are open at the lower surface of the electrically conductive plate 30, the gas passes through the gas intermediate passages 50 and is distributed to the plurality of gas supply passages 52, and the gas is supplied to the lower surface of a wafer W. In the wafer placement table 10, the number of the gas introduction passages 54 extending through the electrically conductive plate 30 is smaller than the number of the gas supply passages 52. Therefore, in comparison with the case where the number of the gas introduction passages 54 extending through the electrically conductive plate 30 is equal to the number of the gas supply passages 52, the soaking performance of a wafer W improves. The upper surfaces of the gas intermediate passages 50 are the electrically conductive bonding layer 40, the lower surfaces of the gas intermediate passages 50 are the electrically conductive plate 30, and the electrically conductive bonding layer 40 and the electrically conductive plate 30 are in contact with each other and have the same potential. Therefore, no potential gradient occurs between the upper and lower sides of each of the gas intermediate passages 50, so electrical discharge in the gas intermediate passages 50 is prevented.

Each of the gas intermediate passages 50 has the recessed groove 31 (first recessed portion) provided on the upper surface of the electrically conductive plate 30. Therefore, the gas intermediate passages 50 can be relatively easily manufactured by closing the upper openings of the recessed grooves 31 with the electrically conductive bonding layer 40.

In addition, one gas introduction passage 54 is provided for each gas intermediate passage 50. Therefore, the number of the gas introduction passages 54 for the gas intermediate passage 50 is minimum (one). Therefore, the soaking performance of a wafer further improves.

Furthermore, the electrically conductive plate 30 has the refrigerant flow channel 32 provided in a one-stroke pattern from one end to the other end over the entire area of the electrically conductive plate 30 in plan view, and the gas introduction passages 54 provided so as to pass between parts of the refrigerant flow channel 32 in the up and down direction. Because of such a structure, the soaking performance of a wafer W improves by reducing the gas introduction passages 54.

Each of the gas supply passages 52 has the electrically insulating porous plug 55. Therefore, it is possible to suppress electrical discharge in the gas supply passages 52. If, for example, the porous plug 55 is not provided, electrons generated as a result of ionization of gas molecules by application of RF accelerate and collide with other gas particles to cause glow discharge and, by extension, arc discharge. However, when the porous plug 55 is provided, electrons collide with the porous plug 55 before colliding with other gas particles, so electrical discharge is suppressed.

Since the gas intermediate passages 50 are cavities, parts where the gas intermediate passages 50 are formed transfer less heat than parts where the gas intermediate passages 50 are not formed. Part of a wafer W, directly above the refrigerant flow channel 32, tends to decrease in temperature due to refrigerant. In the above-described embodiment, the overlapping parts 50p (the shaded parts in FIG. 5) of the gas intermediate passages 50, overlapping the refrigerant flow channel 32 along the refrigerant flow channel 32 in plan view, suppress a decrease in temperature. As a result, the soaking performance of a wafer W improves.

Furthermore, the width of each gas intermediate passage 50 is preferably greater than or equal to 1 mm, and the depth of each gas intermediate passage 50 is preferably greater than or equal to 0.1 mm. When the width of each gas intermediate passage 50 is greater than or equal to 1 mm, the diameter of a grinding wheel used in forming the recessed grooves 31 is not too small, so machining time reduces, and machining cost is reduced. When the depth of each gas intermediate passage 50 is greater than or equal to 0.1 mm, gas easily flows through the gas intermediate passages 50. The thickness of part of the electrically conductive plate 30 over the refrigerant flow channel 32 is preferably less than or equal to 3 mm. With this configuration, a large temperature difference is difficult to occur in the up and down direction in part of the electrically conductive plate 30 over the refrigerant flow channel 32, and stress is difficult to be generated in that part, so it is possible to prevent breakage of the part by stress. In this case, the depth of each gas intermediate passage 50 is preferably greater than or equal to 0.1 mm and less than or equal to 2 mm.

Incidentally, it is conceivable that the gas intermediate passages 50 are incorporated in the electrically conductive plate 30. However, if the gas intermediate passages 50 are incorporated in parts of the electrically conductive plate 30 under the refrigerant flow channel 32, all the plurality of gas supply passages 52 pass between parts of the refrigerant flow channel 32, so the soaking performance of a wafer W is impaired. On the other hand, if the gas intermediate passages 50 are incorporated in parts of the electrically conductive plate 30 over the refrigerant flow channel 32, the parts need to be thickened, so an inconvenience, such as a decrease in cooling efficiency, occurs. Therefore, as in the case of the above-described embodiment, it is preferable that the gas intermediate passages 50 are provided at the interface between the electrically conductive bonding layer 40 and the electrically conductive plate 30.

The present invention is not limited to the above-described embodiment, and can be carried out by various modes as long as they belong to the technical scope of the invention.

Figure 7:
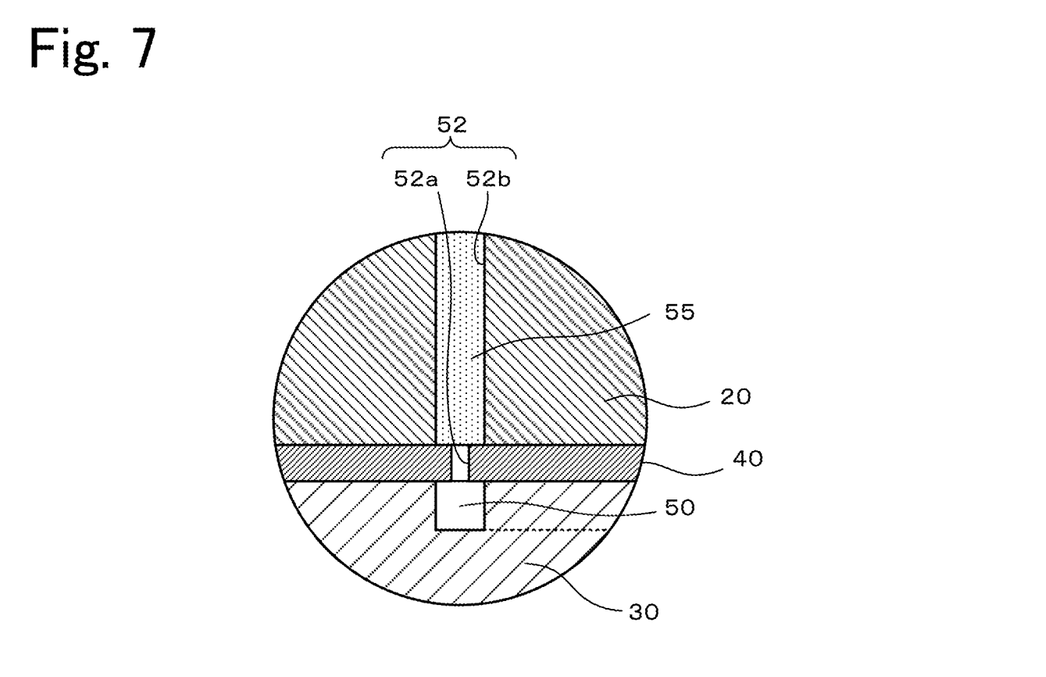
Figure 8:
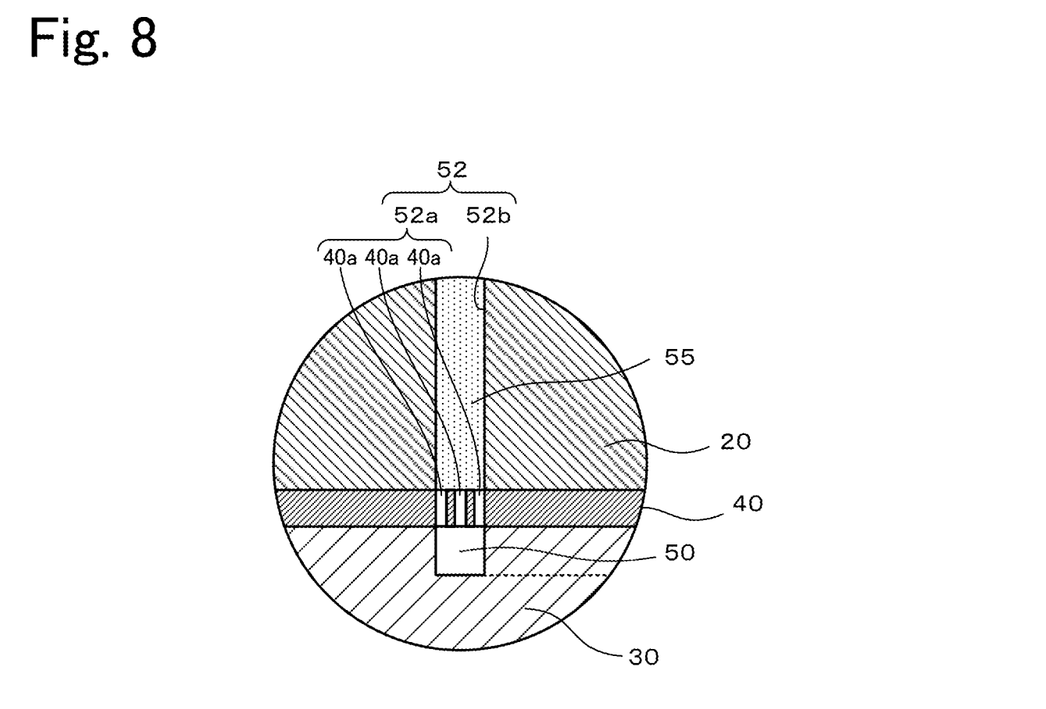

In the above-described embodiment, the lower end of the porous plug 55 may contact with the electrically conductive bonding layer 40. For example, as shown in FIG. 7, the lower end of the porous plug 55 may be configured to contact with the electrically conductive bonding layer 40 by reducing the hole diameter of each bonding layer penetrating part 52a as compared to the hole diameter of each ceramic plate penetrating part 52b in the gas supply passage 52. The hole diameter of each bonding layer penetrating part 52a is preferably less than or equal to 5 mm. Alternatively, as shown in FIG. 8, the bonding layer penetrating parts 52a of each gas supply passage 52 are made up of a plurality of small holes 40a of which the hole diameter is less than the hole diameter of each of the ceramic plate penetrating parts 52b. Thus, the lower end of the porous plug 55 may be configured to contact with the electrically conductive bonding layer 40. The hole diameter of each small hole 40a is preferably less than or equal to 5 mm. In FIGS. 7 and 8, like reference signs are assigned to the same components as those of the above-described embodiment. In any of FIGS. 7 and 8, no potential gradient occurs between the lower end of the porous plug 55 and the electrically conductive bonding layer 40 or between the lower end of the porous plug 55 and the electrically conductive plate 30. Therefore, it is possible to suppress electrical discharge around the lower end of each porous plug 55. When the porous plug 55 is inserted in each of the gas supply passages 52, it is possible to bring the lower end of the porous plug 55 into contact with the electrically conductive bonding layer 40 only by inserting each of the porous plugs 55 until the porous plug 55 touches an area around a corresponding one of the bonding layer penetrating parts 52a of the electrically conductive bonding layer 40.

In the above-described embodiment, the porous plug 55 is filled in each ceramic plate penetrating part 52b of the gas supply passage 52; however, the configuration is not limited thereto. For example, the porous plug 55 may be filled in the entire gas supply passage 52 (the bonding layer penetrating part 52a and the ceramic plate penetrating part 52b) or the lower end of the porous plug 55 may reach the lower surface of the gas intermediate passage 50. In this case as well, as in the case of FIGS. 7 and 8, no potential gradient occurs between the lower end of the porous plug 55 and the electrically conductive bonding layer 40 or between the lower end of the porous plug 55 and the electrically conductive plate 30. Therefore, it is possible to suppress electrical discharge around the lower end of each porous plug 55.

Figure 9:
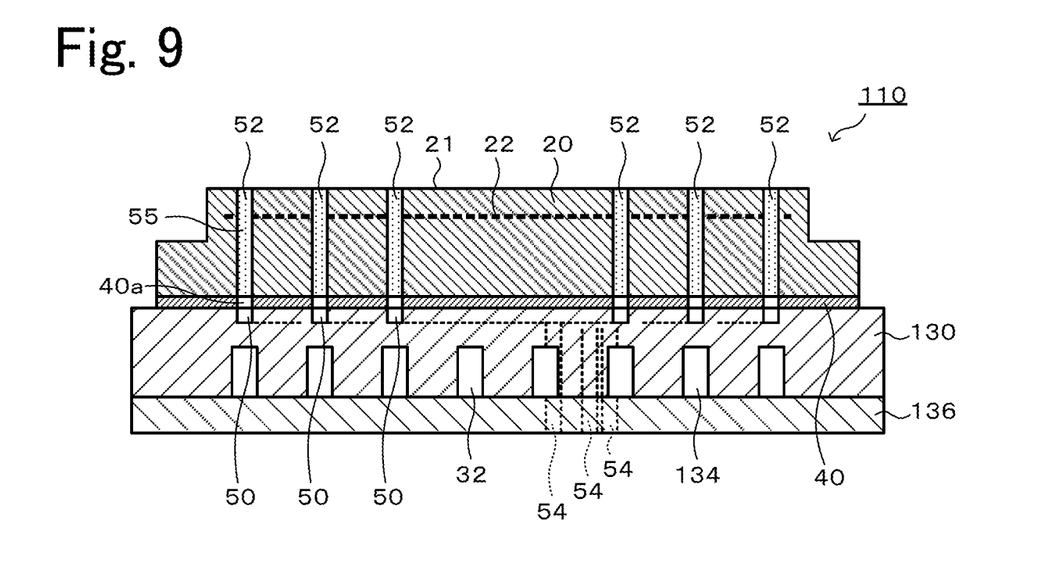
FIG. 9 is a longitudinal sectional view of a wafer placement table 110.

In the above-described embodiment, the electrically conductive plate 30 has the refrigerant flow channel 32; however, the configuration is not limited thereto. For example, as in the case of a wafer placement table 110 shown in FIG. 9, an electrically conductive plate 130 may have a refrigerant flow channel groove 134 on its lower surface, and the refrigerant flow channel 32 may be configured by closing the lower opening of the refrigerant flow channel groove 134 with a circular plate 136 disposed on the lower surface of the electrically conductive plate 130. In FIG. 9, like reference signs are assigned to the same components as those of the above-described embodiment. The electrically conductive plate 130 and the circular plate 136 are united by a clamp mechanism (not shown) in a state of being sealed in a liquid-tight manner such that no refrigerant leaks from the refrigerant flow channel 32 to the outer peripheral side. Each of the gas introduction passages 54 is made up of a part passing through the electrically conductive plate 130 and a part passing through the circular plate 136. A joint between both parts (between the electrically conductive plate 130 and the circular plate 136) is airtightly sealed. The electrically conductive plate 130 and the circular plate 136 both may be made of the same material (for example, MMC). Alternatively, the electrically conductive plate 130 may be made of an expensive material (for example, MMC), and the circular plate 136 may be made of a material (for example, metals, such as aluminum and aluminum alloys, ceramics, such as alumina, and the like) lower in cost than the material. The circular plate 136 may be a wafer placement table-side component or may be a chamber-side component.

Figure 10:
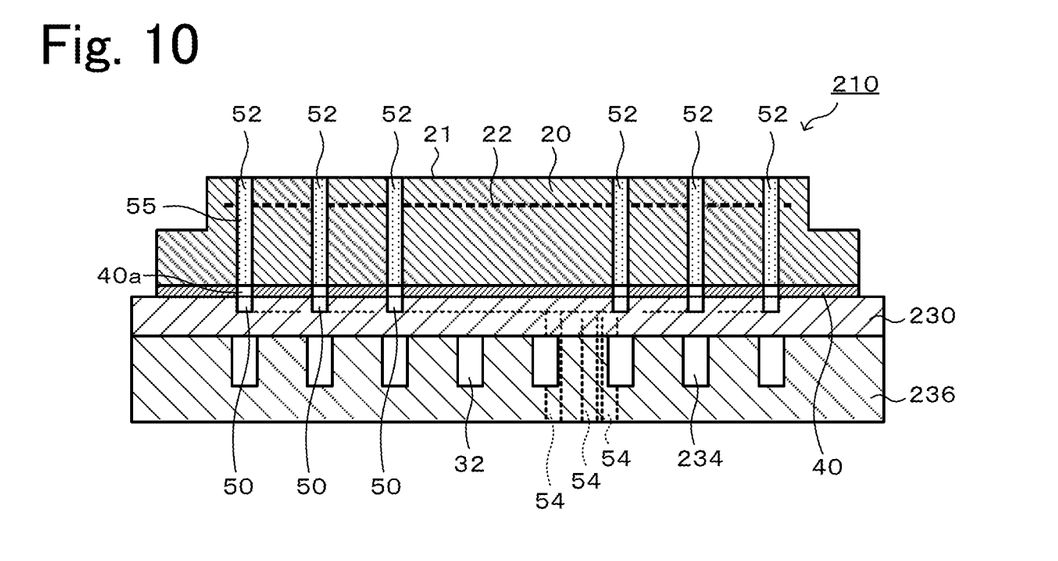
FIG. 10 is a longitudinal sectional view of a wafer placement table 210.

Alternatively, as in the case of a wafer placement table 210 shown in FIG. 10, an electrically conductive plate 230 may be configured not to have a refrigerant flow channel or a refrigerant flow channel groove. The refrigerant flow channel 32 may be configured by providing a refrigerant flow channel groove 234 on the upper surface of a circular plate 236 disposed on the lower surface of the electrically conductive plate 230 and closing the upper opening of the refrigerant flow channel groove 234 with the electrically conductive plate 230. In FIG. 10, like reference signs are assigned to the same components as those of the above-described embodiment. The electrically conductive plate 230 and the circular plate 236 are united by a clamp mechanism (not shown) in a state of being sealed in a liquid-tight manner such that no refrigerant leaks from the refrigerant flow channel 32 to the outer peripheral side. Each of the gas introduction passages 54 is made up of a part passing through the electrically conductive plate 230 and a part passing through the circular plate 236. A joint between both parts (between the electrically conductive plate 230 and the circular plate 236) is airtightly sealed. The electrically conductive plate 230 and the circular plate 236 both may be made of the same material (for example, MMC). Alternatively, the electrically conductive plate 230 may be made of an expensive material (for example, MMC), and the circular plate 236 may be made of a material (for example, metals, such as aluminum and aluminum alloys, ceramics, such as alumina, and the like) lower in cost than the material. The circular plate 236 may be a wafer placement table-side component or may be a chamber-side component.

In the above-described embodiment, the porous plug 55 is disposed in the gas supply passage 52; however, the porous plug 55 does not need to be disposed in the gas supply passage 52.

In the above-described embodiment, each gas intermediate passage 50 has a recessed groove 31 (first recessed portion) provided on the upper surface of the electrically conductive plate 30 and formed by disposing the lower surface (flat surface) of the electrically conductive bonding layer 40 on the recessed groove 31; however, the configuration is not limited thereto. For example, each gas intermediate passage 50 may have a recessed groove (second recessed portion) provided on the lower surface of the electrically conductive bonding layer 40, and the upper surface (flat surface) of the electrically conductive plate 30 may be disposed under the recessed groove. Alternatively, the electrically conductive bonding layer 40 may have an upper and lower two-layer structure, a groove (a groove extending through in the up and down direction) that will be finally the gas intermediate passage 50 may be provided in the lower layer, and the above-described bonding layer penetrating part 52a may be provided in the upper layer. With this configuration as well, the wafer placement table 10 can be relatively easily manufactured.

In the above-described embodiment, the upper surface of the porous plug 55 has the same level as the reference surface 21c of the wafer placement surface 21; however, the configuration is not limited thereto. For example, a difference obtained by subtracting the height of the upper surface of the porous plug 55 from the height of the reference surface 21c of the wafer placement surface 21 may be less than or equal to 0.5 mm (preferably less than or equal to 0.2 mm, more preferably less than or equal to 0.1 mm). In other words, the upper surface of the porous plug 55 may be disposed at a position lower by 0.5 mm or less (preferably 0.2 mm or less, more preferably 0.1 mm or less) than the reference surface 21c of the wafer placement surface 21. With this configuration as well, the height of the space between the lower surface of a wafer W and the upper surface of the porous plug 55 is suppressed to a relatively low height. Therefore, it is possible to prevent occurrence of glow discharge and, by extension, arc discharge in this space.

In the above-described embodiment, the electrostatic electrode is incorporated in the ceramic plate 20 as the electrode 22. Instead of or in addition to this, a heater electrode (resistance heating element) may be incorporated. In this case, a heater power supply is connected to the heater electrode. The ceramic plate 20 may incorporate one layer of electrode or may incorporate two or more layers of electrode with a gap.

In the above-described embodiment, lift pin holes extending through the wafer placement table 10 may be provided. The lift pin holes are holes for allowing insertion of lift pins used to raise and lower a wafer W with respect to the wafer placement surface 21. The lift pin holes are provided at three locations when a wafer W is supported by, for example, three lift pins.

In the above-described embodiment, the ceramic plate 20 is made by firing a ceramic powder molded body by hot pressing. The molded body at that time may be made by laminating a plurality of tape molds, or may be made by mold casting, or may be made by compacting ceramic powder.

In the above-described embodiment, the gas intermediate passages 50 are provided at the interface between the electrically conductive bonding layer 40 and the electrically conductive plate 30. Alternatively, the gas intermediate passages 50 may be embedded in the electrically conductive bonding layer 40.

The application claims the benefit of Japanese Patent Application No. 2022-058340 filed Mar. 31, 2022, which is hereby incorporated by reference herein in its entirety.

What is claimed is:

1. A wafer placement table comprising:
a ceramic plate having a wafer placement surface on its upper surface and incorporating an electrode;
an electrically conductive plate provided on a lower surface side of the ceramic plate;
an electrically conductive bonding layer that bonds the ceramic plate with the electrically conductive plate;
a gas intermediate passage embedded in the electrically conductive bonding layer or provided at an interface between the electrically conductive bonding layer and the electrically conductive plate;
a plurality of gas supply passages extending from the gas intermediate passage through the electrically conductive bonding layer and the ceramic plate to the wafer placement surface;
a gas introduction passage provided so as to extend through the electrically conductive plate in an up and down direction and communicate with the gas intermediate passage, the number of the gas introduction passages being smaller than the number of gas supply passages constituting the plurality of gas supply passages communicating with the gas intermediate passage and refrigerant flow channels in the electrically conductive plate formed in a one-stroke pattern with multiple circles over the area of the electrically conductive plate;

wherein each of the gas intermediate passages has an overlapping part that overlaps the refrigerant flow channel along the refrigerant flow channel in plan view;

wherein the gas supply passages each have an electrically insulating plug;

wherein each of the gas supply passages has a bonding layer penetrating part extending through the electrically conductive bonding layer and a ceramic plate penetrating part extending through the ceramic plate;

wherein a diameter of the bonding layer penetrating part is less than a diameter of the ceramic plate penetrating part; and wherein a lower end of the electrically insulating plug is in contact with an area around the bonding layer penetrating part in the electrically conductive bonding layer.

2. The wafer placement table according to claim 1, wherein
the gas intermediate passage has at least one of a first recessed portion provided on an upper surface of the electrically conductive plate or a second recessed portion provided on a lower surface of the electrically conductive bonding layer.

3. The wafer placement table according to claim 1, wherein
the gas introduction passage is provided one for each gas intermediate passage.

4. The wafer placement table according to claim 1, wherein
the gas intermediate passage has a depth of greater than or equal to 0.1 mm and less than or equal to 2 mm.

5. The wafer placement table according to claim 1, wherein
the gas intermediate passage is annular in plan view, and
the gas introduction passages and the gas intermediate passage are connected by an auxiliary passage provided in the same plane as a plane in which the gas intermediate passage is provided.

6. The wafer placement table according to claim 1, wherein the electrically insulating plug is porous.

* * * * *